United States Patent
Doris (10) Patent No.: US 10,135,015 B1
(45) Date of Patent: Nov. 20, 2018

(54) ELECTROCHEMICAL CLOCK AND OSCILLATOR DEVICES

(71) Applicant: Palo Alto Research Center Incorporated, Palo Alto, CA (US)

(72) Inventor: Sean E. Doris, San Francisco, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 15/802,215

(22) Filed: Nov. 2, 2017

(51) Int. Cl.
    G01N 27/414    (2006.01)
    H01L 51/05     (2006.01)
    H03K 3/354     (2006.01)
    H01L 51/10     (2006.01)
    H03K 3/40      (2006.01)
    H01L 51/00     (2006.01)

(52) U.S. Cl.
    CPC .......... H01L 51/0508 (2013.01); H01L 51/10 (2013.01); H03K 3/354 (2013.01); H03K 3/40 (2013.01); H01L 51/0035 (2013.01); H01L 51/0037 (2013.01)

(58) Field of Classification Search
    CPC .................. G01N 27/414; G01N 27/4148
    See application file for complete search history.

(56) References Cited

U.S. PATENT DOCUMENTS

| 4,397,714 A     | * | 8/1983 | Janata | G01N 27/4148 204/406 |
| 2018/0066132 A1 | * | 3/2018 | Nair   | C08L 41/00 |

OTHER PUBLICATIONS

Cho et al., Nature Materials, vol. 7, pp. 900-906, 2008.*

* cited by examiner

*Primary Examiner* — Thomas L Dickey
(74) *Attorney, Agent, or Firm* — Shun Yao; Park, Vaughan, Fleming & Dowler LLP (57) ABSTRACT

One embodiment provides an oscillator. The oscillator can include an organic electrochemical transistor, which comprises a channel and a dynamic gate. The channel can include one of: a conductive polymer, a conductive inorganic material, and a small-molecule material. An electrochemical potential of the dynamic gate can vary substantially periodically, thereby resulting in the organic electrochemical transistor having a drain current that varies substantially periodically.

18 Claims, 9 Drawing Sheets

ELECTROCHEMICAL CLOCK AND OSCILLATOR DEVICES

BACKGROUND

Field

The present disclosure relates to organic electrochemical devices. More specifically, the present disclosure relates to electrochemical oscillators based on organic electrochemical transistors (OECTs).

Related Art

In recent years, printed electronics has become one of the fastest growing technologies in the world. It has found application over a wide range of industries, including consumer goods, healthcare, aerospace, electronics, media and transit. Printed electronics technology has allowed electronics to be used in new areas, as well as improving existing electronics.

Like any other type of electronic circuit, timing/clock modules are crucial components. In currently available printed electronic circuits, timing and clock functionality is typically implemented with a ring oscillator, which can be built based on various printed transistors (e.g., printed nanotube transistors). Current printed ring oscillators typically have an oscillation frequency on the order of kHz to MHz, which may not meet the needs of polling of sensors in a sensor network. Note that, in a sensor network, the polling of the sensors may only happen every second, minute, or hour. This requires a significantly slower clock that is on the order of Hz or slower. In addition to the application in sensor networks, slower clock rates can provide acceptable circuit performance for some applications with dramatically reduced power consumption.

Although 555 timer integrated circuit (IC) chips have provided clock and timing functionalities at low frequencies, achieving low-frequency operations of clock and timing functionality with low-cost, flexible, and printed components can be challenging.

On the other hand, organic electrochemical transistors (OECTs) have the characteristics of low operating voltage, compatibility with aqueous solutions, bio-compatibility, and high transconductance, and they have been explored for applications in chemical sensing, biological sensing and interfacing, neuromorphic computing, logic, and printed electronics.

SUMMARY

One embodiment provides an oscillator. The oscillator can include an organic electrochemical transistor, which comprises a channel and a dynamic gate. The channel can include one of: a conductive polymer, a conductive inorganic material, and a small-molecule material. An electrochemical potential of the dynamic gate can vary substantially periodically, thereby resulting in the organic electrochemical transistor having a drain current that varies substantially periodically.

In a variation on this embodiment, the conductive polymer comprises poly(3,4-ethylenedioxythiophene) polystyrene sulfonate (PEDOT:PSS).

In a variation on this embodiment, the dynamic gate can include an electrochemical reaction system comprising at least two cross-coupled reaction pathways.

In a further variation, the at least two reaction pathways can include a direct pathway of formic acid oxidation and an indirect pathway of the formic acid oxidation.

In a variation on this embodiment, the dynamic gate comprises a gate electrode, a gate electrolyte, and a counter-electrode. The gate electrode can be coupled to the counter-electrode via the gate electrolyte.

In a further variation, the dynamic gate further comprises a current source configured to provide a constant current between the gate electrode and the counter-electrode.

In a further variation, the constant current is between 10 nA and 1 mA.

In a further variation, the dynamic gate can further include a voltage source configured to provide a constant voltage bias between the gate electrode and the counter-electrode.

In a further variation, the constant voltage is between 100 mV and 10 V.

In a further variation, the oscillator can further include a channel electrolyte positioned between the channel and the dynamic gate.

In a further variation, the oscillator can further include a membrane separating the gate electrolyte and the channel electrolyte.

In a further variation, the membrane can include one or more of: a porous glass frit, an ion-selective membrane, an ion-conductive glass, a polymer membrane, and an ionically conductive membrane.

In a further variation, the gate electrolyte or the channel electrolyte can include at least one of: water, an organic solvent, an ionic liquid, and a polymer electrolyte.

In a further variation, the gate electrolyte or the channel electrolyte comprises a dissolved organic or inorganic species.

In a variation on this embodiment, the drain current of the organic electrochemical transistor varies with time at a frequency between 10 $\mu$Hz and 100 Hz.

One embodiment provides an organic electrochemical transistor (OECT). The OECT can include a polymer-based channel and a dynamic gate coupled to the polymer-based channel via a channel electrolyte. The dynamic gate can include a gate electrode and a counter-electrode separated from the gate electrode by a gate electrolyte. An electrochemical potential of the dynamic gate is time-varying, thereby resulting in the organic electrochemical transistor having a drain current that is time-varying.

BRIEF DESCRIPTION OF THE FIGURES

In the figures, like reference numerals refer to the same figure elements.

DETAILED DESCRIPTION

Overview

Embodiments described herein provide a solution to the technical problems of enabling low-frequency operations of an oscillation for applications of printed electronics. This novel printed oscillator can be built based on an organic electrochemical transistor (OECT). More specifically, the OECT can include a dynamic gate coupled to a channel via an electrolyte, also referred to as the channel electrolyte. The dynamic gate itself can include two electrodes (e.g., a gate electrode and a counter-gate electrode) that are coupled to each other via an electrolyte, also referred to as the gate electrolyte. The cross-coupling between the multiple electrochemical reactions occurring at the gate electrode can result in the dynamic gate having a time-varying electrochemical potential. Because the channel current depends on the electrochemical potential of the OECT gate, the time-varying electrochemical potential at the OECT gate can result in the drain current oscillating with time.

OECT Principle

Figure 1:
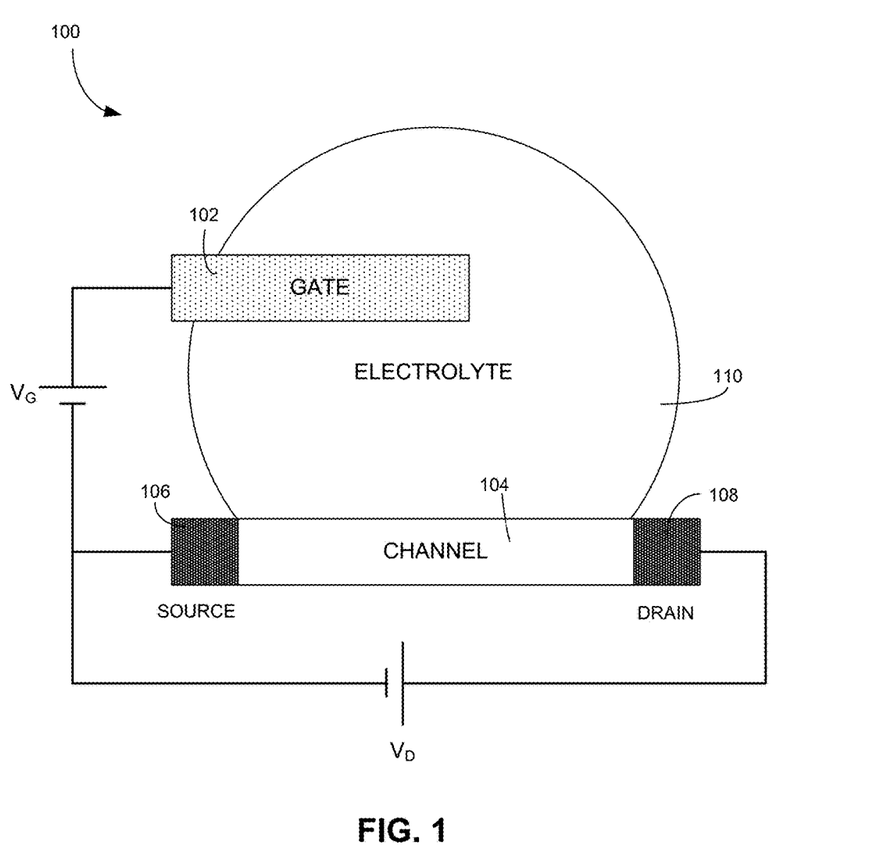
FIG. 1 illustrates a schematic of an organic electrochemical transistor (OECT).

FIG. 1 illustrates a schematic of an organic electrochemical transistor (OECT). OECT 100 can include gate electrode 102, channel 104, which typically can include a semiconductor film (e.g., a conjugate polymer film), source electrode 106, drain electrode 108, and electrolyte 110. Source electrode 106 and drain electrode 108 can establish electrical contact to channel 104, while gate electrode 102 establishes electrical contact to electrolyte 110. Electrolyte 110 can be liquid, gel, or solid. In the most common biasing configuration as shown in FIG. 1, source electrode 106 is grounded and a voltage (drain voltage $V_D$) is applied to the drain. This can cause a current to flow (drain current), due to electronic charge (usually holes) present in channel 104. When a voltage is applied to the gate (gate voltage $V_G$), ions from the electrolyte are injected into the channel and change the electronic charge density, and hence the drain current. When the gate voltage is removed and the gate is shorted to the source, the injected ions return to the electrolyte and the drain current goes back to its original value.

PEDOT:PSS (poly(3,4-ethylenedioxythiophene) polystyrene sulfonate) is a commonly used channel material due to its commercial availability and high electronic and ionic conductivity. PEDOT:PSS is a polymer mixture of two ionomers. One component in this mixture is made up of sodium polystyrene sulfonate, which is a sulfonated polystyrene (or PSS). Part of the sulfonyl groups are deprotonated and carry a negative charge. The other component (PEDOT) is a conjugated polymer and carries positive charges. Because the organic semiconductor PEDOT is doped p-type by the sulfonate anions of the PSS (the dopant), PEDOT:PSS can exhibit a high (hole) conductivity. Hence, in the absence of a gate voltage, the drain current will be high and the transistor will be in the ON state. When a positive voltage is applied to the gate, ions from the electrolyte (e.g., NaCl in water) are injected into the PEDOT:PSS channel, where they compensate for the sulfonate anions. This leads to de-doping of the PEDOT, and the transistor reaches its OFF state.

For OECTs, the channel doping level at zero gate bias is not necessarily the same as the channel's native doping level. Rather, the OECT's channel doping level can depend on the difference between the electrochemical potentials of the channel polymer redox process and the redox process occurring at the gate. Hence, by tuning the electrochemical potential of the gate (e.g., by selecting appropriate gate redox-couples), one can achieve tuning of the threshold voltage of the OECT. A detailed description of OECTs with a tunable threshold voltage can be found in co-pending U.S. patent application Ser. No. 15/801,125, entitled "ORGANIC ELECTROCHEMICAL TRANSISTORS WITH TUNABLE THRESHOLD VOLTAGE," filed Nov. 1, 2017, the disclosure of which is incorporated herein by reference in its entirety.

If the electrochemical potential of the gate oscillates with time and if a constant gate voltage ($V_G$) is applied, the channel conductance can oscillate with time as well, resulting in a single-transistor oscillator.

Electrochemical Reaction with a Time-Varying Potential

Time variations of potential in the electrolyte bath have been observed during electropolishing of various metals (e.g., Ni, Cu, Ag, stainless steel, etc.). It is believed that periodic or pseudo-periodic formation and dissolution of surface films on the electrodes can be responsible for such a phenomenon. Similarly, it has been demonstrated that, in an electrochemical system, if multiple electrochemical potential reaction pathways are possible, then the reaction pathway with the lowest activation barrier will proceed. Furthermore, if the electrochemical reactions are coupled (e.g., the occurrence of one reaction changes the activation barrier for the other reaction), then it is possible to establish a system where the reaction pathway alternates among multiple available pathways, leading to an oscillation or time variation in electrochemical potential. For example, the reaction mechanism for the electrochemical oxidation of formic acid (FA) on platinum (Pt) can be considered a dual-path mechanism, which includes a direct path intermediate (e.g., adsorbed formate) and an indirect path involving a strongly adsorbed intermediate, i.e., adsorbed CO.

Figure 2A:
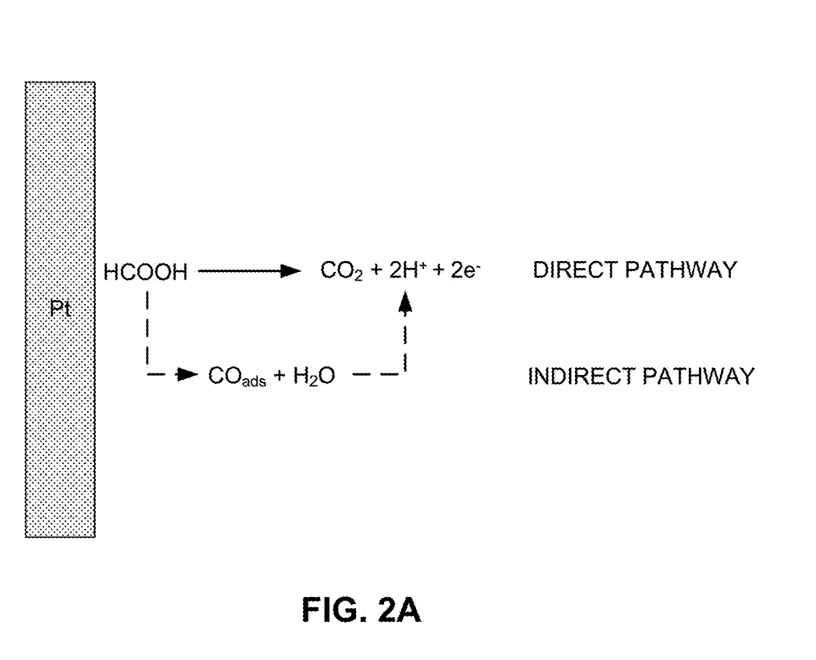
FIG. 2A illustrates the oxidation of the formic acid on the Pt surface.

FIG. 2A illustrates the oxidation of the formic acid on the Pt surface. For a direct pathway reaction, dehydrogenation occurs at C—H and O—H bonds sequentially (in either order) to generate $CO_2$. For an indirect pathway reaction, CO is produced by non-Faradaic dehydration of the FA, and then CO is further oxidized to $CO_2$, as indicated by the dashed arrows. The different pathways have different activation barriers and can occur at different conditions. More specifically, the formation and oxidation of the intermediate CO species plays an important role. When the indirect pathway reaction occurs, intermediate CO is generated and can be strongly adsorbed on the Pt surface, poisoning the Pt surface. As the potential of the Pt electrode changes and the adsorbed CO is oxidized and removed from the electrode surface, the direct pathway reaction can be resumed. This triggers another round of indirect pathway reaction. The alternating occurrences of the direct pathway reaction and the indirect pathway reaction of the FA oxidation can lead to the oscillation or time-variation of the potentials of the Pt electrode. In the mean time, the reduction of protons to hydrogen gas can occur at the counter-electrode.

Figure 2B:
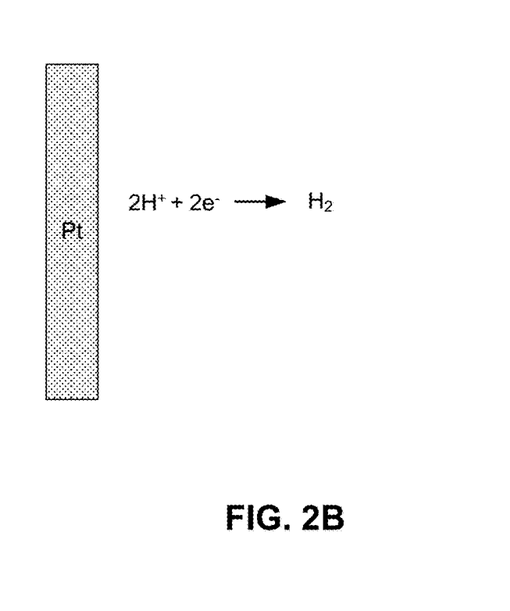
FIG. 2B illustrates the reduction of proton to hydrogen gas on the Pt surface.
Figure 2C:
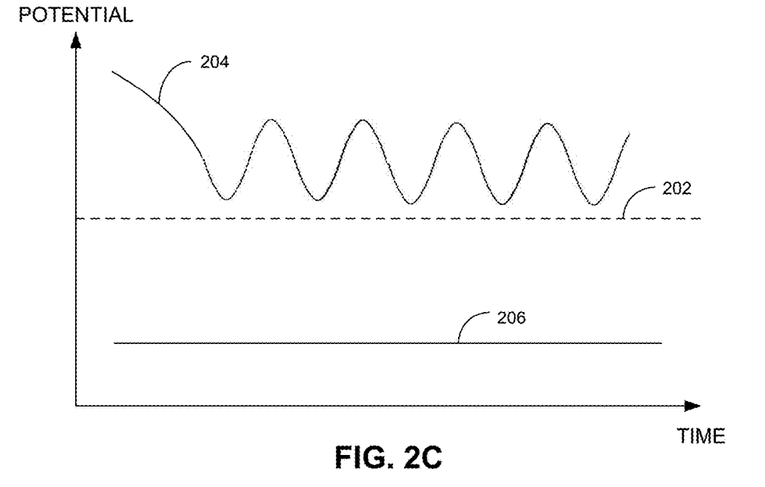
FIG. 2C illustrates the potentials of the Pt electrode and counter-electrode as a function of time.

FIG. 2B illustrates the reduction of proton to hydrogen gas on the Pt surface. This reduction reaction only has a single pathway and does not cause potential fluctuation. FIG. 2C illustrates the potentials of the Pt electrode and counter-electrode as a function of time. In FIG. 2C, dashed line 202 indicates the potential of a reference electrode, solid line 204 indicates the potential of the Pt electrode, and solid line 206 indicates the potential of the counter-electrode. As one can see from FIG. 2C, the potential of the Pt electrode oscillates with time, whereas the potential of the counter-electrode remains constant. As a result, the potential difference between the Pt electrode and the counter-electrode oscillates with time as well.

In addition to the FA oxidation, there are other systems with oscillating or time-varying electrochemical potentials. For example, it has been observed that during cathodic polarization of a platinized Pt in HCl, because of the formation of $H_2$ bubbles, which leads to a change in mass transport, electrochemical potential can oscillate. Other feedback mechanisms for the potential oscillation can also include a periodic change in catalyst activity, surface charge, or pH-changing molecules.

For example, it has been shown that the rate of the redox reaction of redox-couple $Fe(CN)_6^{3-/4-}$ on a charged surface may be pH dependent. More specifically, decreased pH levels of the electrolyte can increase the reaction rate. On the other hand, the redox reaction of some redox-couples, such as quinone/hydroquinone ($Q/QH_2$), can change the pH level of the environment. These two redox-couples have different redox potentials. Therefore, if a system includes both redox couples, the kinetics of these two redox reactions may cross-couple, resulting in the electrochemical potential of the entire system oscillating upon the application of a constant voltage or current. On the other hand, because both redox reactions are reversible, the reagents that are consumed at the gate electrode can be re-generated at the counter-electrode, improving the lifetime of the oscillator.

Figure 2D:
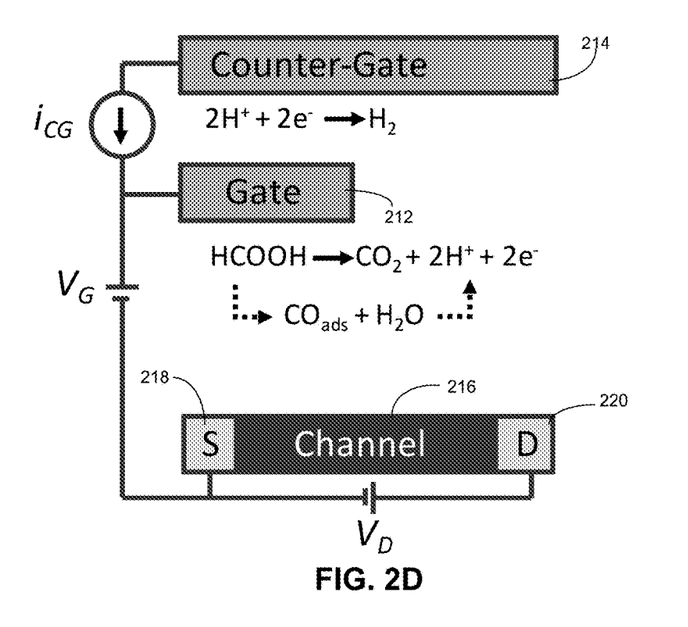
FIG. 2D illustrates an exemplary operation principle of an OECT gated with an electrochemical oscillator, according to one embodiment.

FIG. 2D illustrates an exemplary operation principle of an OECT gated with an electrochemical oscillator, according to one embodiment. In FIG. 2D, a DC current ($i_{CG}$) is driven between gate electrode 212 and counter-gate electrode 214. This DC current can induce electrochemical reactions at gate electrode 212 and counter-gate electrode 214. FIG. 2D also shows the cross-coupling between the direct pathway reaction (indicated by the solid arrow) and the indirect pathway reaction (indicated by the dashed arrows) at the gate electrode. As for the OECT, a gate voltage ($V_G$) can be applied between gate electrode 212 and channel 216, and a drain voltage ($V_D$) can be applied between source electrode 218 and drain electrode 220 of channel 216.

Figure 3:
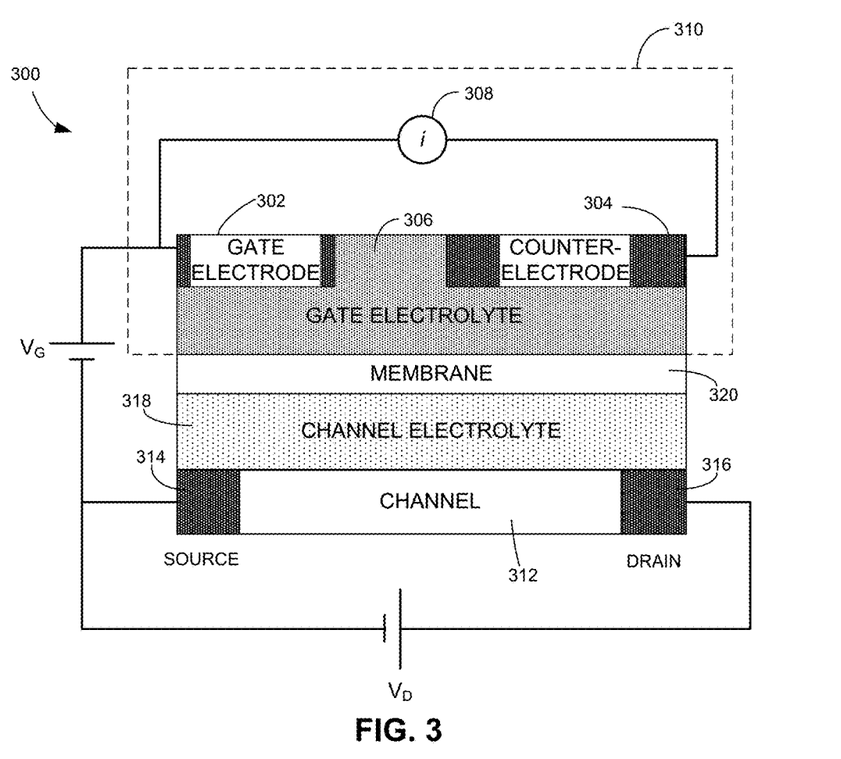
FIG. 3 illustrates a schematic of a novel OECT-based single-transistor oscillator, according to one embodiment.

FIG. 3 illustrates a schematic of a novel OECT-based single-transistor oscillator, according to one embodiment. Oscillator 300 can include a gate electrode 302, a counter-electrode 304, a gate electrolyte layer 306 separating gate electrode 302 and counter-electrode 304, and a current source 308 coupling gate electrode 302 and counter-electrode 304. Gate electrode 302, counter-electrode 304, gate electrolyte 306, and current source 308 together form a dynamic gate 310 that has a time-varying potential across the gate. Oscillator 300 can further include a channel 312, a source electrode 314, a drain electrode 316, a channel electrolyte layer 318, and a membrane layer 320.

In some embodiments, dynamic gate 310 can include a FA oxidation-and-reduction system. More specifically, gate electrolyte layer 306 can include a mixture of formic acid and sulfuric acid. For example, gate electrolyte layer 306 can include 1.0 Molar (or M) formic acid mixed in 0.5 M of de-gassed sulfuric acid. Gate electrode 302 and counter-electrode 304 can each include a wire or a strip made of one or more noble metals, such as Pt, Pd, and Au. In alternative embodiments, dynamic gate 310 can include at least two redox-couples, and the redox reaction kinetics of the two redox-couples can be cross-coupled. For example, gate electrolyte layer 306 may include redox-couples $Fe(CN)_6^{3-/4-}$ and $Q/QH_2$, both of which can be dissolved in a solution (e.g., NaCl in water).

Current source 308 can provide a constant current to the system within dynamic gate 310, between electrode 302 and counter-electrode 304. In some embodiments, current source 308 can provide a constant current between 10 nA and 1 mA. In a further embodiment, current source 307 can provide a constant current of 50 µA.

Channel 312 can be made of conductive polymers with high carrier mobility, such as PEDOT:PSS (poly(3,4-ethylenedioxythiophene) polystyrene sulfonate). In addition to conductive polymer, channel 312 can also be made of a conductive inorganic material or a small-molecule material. The size and shape of the channel can be determined based on the application. In some embodiments, channel 312 can have a dimension of 100×10 µm². In some embodiments, channel 312 can shape like a rectangular or U-shaped. Source electrode 314 and drain electrode 316 can be made of any type of conductive material and are configured to electrically contact either end of channel 312. Channel electrolyte layer 318 can include various types of electrolyte solution, such as water with dissolved salt (e.g., NaCl), an organic solvent with dissolved salt, an ionic liquid, etc. In one embodiment, channel electrolyte layer 318 can include 0.1 M NaCl solution. Alternatively, electrolyte layer 318 can include electrolyte in gel or solid form (e.g., polymer electrolyte). In further embodiments, channel electrolyte layer 318 can include dissolved organic or inorganic species.

Membrane layer 320 can be used to separate gate electrolyte layer 306 from channel electrolyte layer 318, thus preventing the gate electrolyte from reacting with the channel material. More specifically, the membrane should allow carrier movements between channel electrolyte layer 318 and gate electrolyte layer 306, while preventing the gate electrolyte from reacting with channel 312. Membrane layer 320 can include a porous glass frit, an ion-selective membrane, ion-conductive glass, a polymer membrane, an ionically conductive membrane, etc.

Figure 4A:
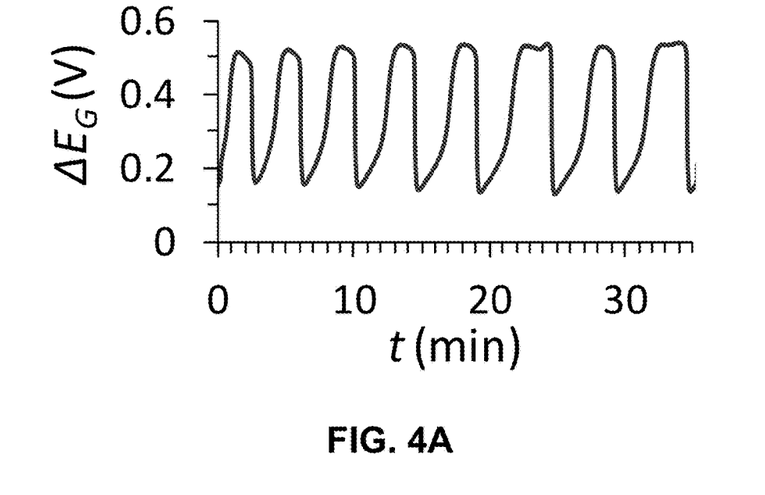
FIG. 4A shows the electrochemical potential at the gate electrode as a function of time, according to one embodiment.
Figure 4B:
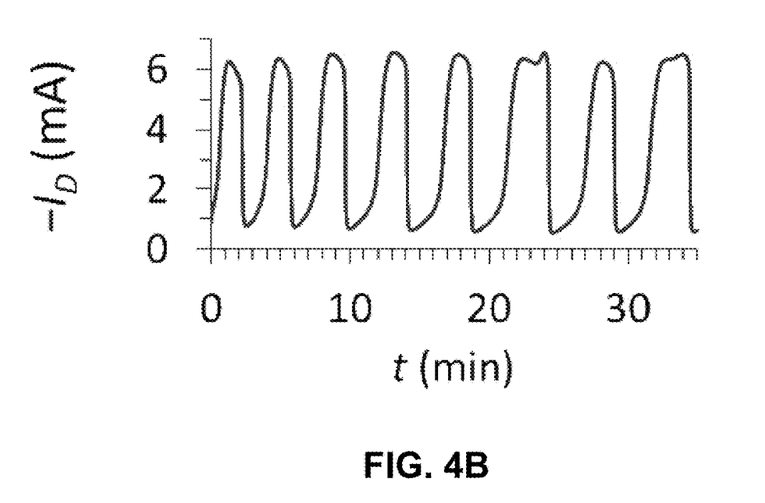
FIG. 4B shows the drain current as a function of time, according to one embodiment.

During operation of oscillator 300, a direct current (DC) voltage (e.g., $V_G$) is applied between gate electrode 302 and source electrode 314, and another DC voltage (e.g., $V_D$) is applied between the drain and source electrodes. In one embodiment, $V_G$ can be set as 0.5 V, and $V_D$ can be set as −0.6 V. Although the gate voltage $V_G$ and drain voltage $V_D$ are constants, the time-varying electrochemical potential of dynamic gate 310 can still cause the channel conductance, hence the drain current, to vary with time. FIG. 4A shows the electrochemical potential at the gate electrode as a function of time, according to one embodiment. FIG. 4B shows the drain current as a function of time, according to one embodiment.

In the example shown in FIG. 4B, the drain current oscillates at a period of about 4.5 min, or a frequency of about 3.7 mHz. The oscillation frequency of the oscillator 300 can be tuned by tuning the electrochemical reaction parameters (e.g., the FA concentration in the gate electrolyte) or the driving current. Compared to conventional ring oscillators, the frequency of the OECT-based single-transistor oscillator can be ultra-low. In some embodiments, the oscillation frequency can be between 10 µHz and 100 Hz. The ultra-low frequency makes this novel OECT-based single-transistor oscillator a perfect candidate for extremely low-power electronics and sensor polling applications. For example, a wearable device (e.g., a smart patch) for monitoring a user's glucose level by analyzing his or her sweat only needs to perform such a test at an interval of 30 minutes or greater. By incorporating this novel OECT-based single-transistor oscillator into the smart patch, the glucose test circuit can be turned on once every hour or once every two hours, thus enabling extremely low-power operation.

Figure 5:
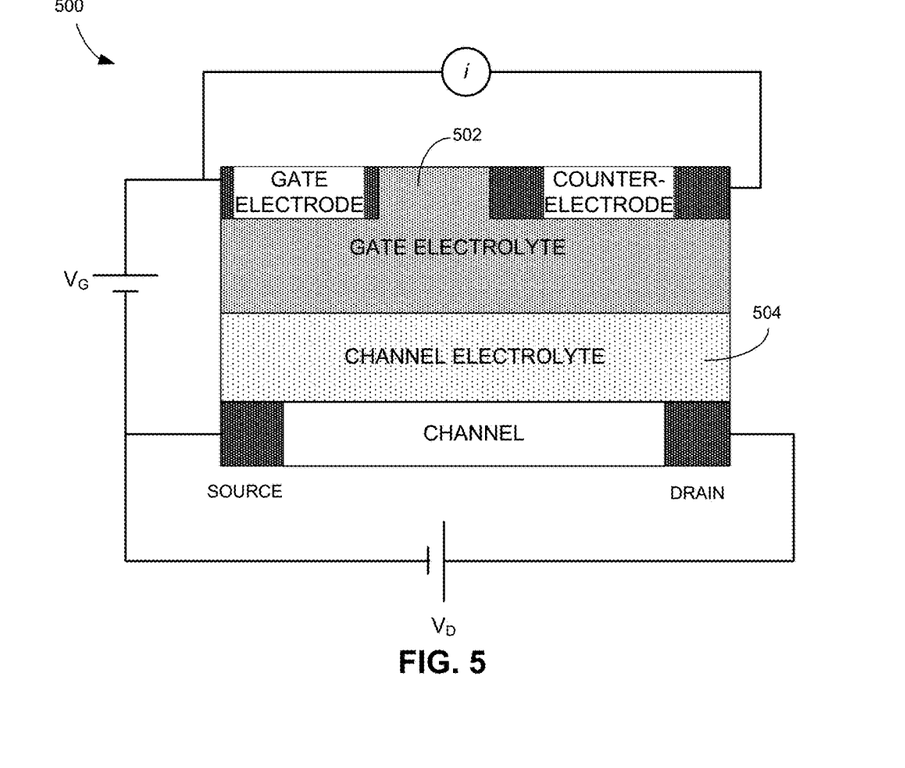
FIG. 5 illustrates a schematic of a novel OECT-based single-transistor oscillator, according to one embodiment.

FIG. 5 illustrates a schematic of a novel OECT-based single-transistor oscillator, according to one embodiment. Oscillator 500 can be similar to oscillator 300, except that there is no membrane layer between gate electrolyte layer 502 and channel electrolyte layer 504. This can be possible when either gate electrolyte layer 502 or channel electrolyte layer 504 is made of electrolyte in solid form (e.g., polymer electrolyte) or when gate electrolyte layer 502 and channel electrolyte layer 504 have the same composition. Note that the purpose of the membrane is to prevent the gate electrolyte from reacting with the channel material. Hence, as long as one of the electrolytes is in solid form, it can effectively prevent the gate electrolyte from contacting or reacting with the channel material. On the other hand, if the gate electrolyte is non-reactive towards the channel material, then the gate and channel electrolytes can be of the same composition and no membrane is required.

Figure 6:
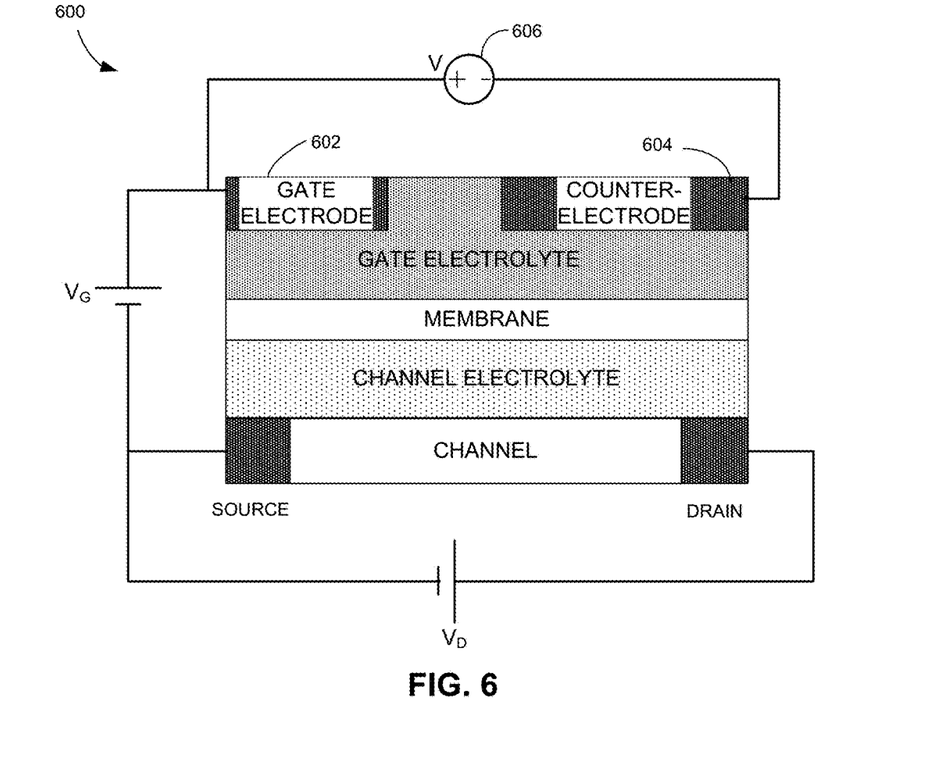
FIG. 6 illustrates a schematic of a novel OECT-based single-transistor oscillator, according to one embodiment.

FIG. 6 illustrates a schematic of a novel OECT-based single-transistor oscillator, according to one embodiment. Oscillator 600 can be similar to oscillator 300, except that, instead of a current source that provides driving current for the reactions occurring in the dynamic gate, a DC voltage is provided between electrode 602 and counter-electrode 604 by a voltage source 606. In some embodiments, the DC voltage between electrode 602 and counter-electrode 604 can be between 10 mV and 10 V.

Figure 7:
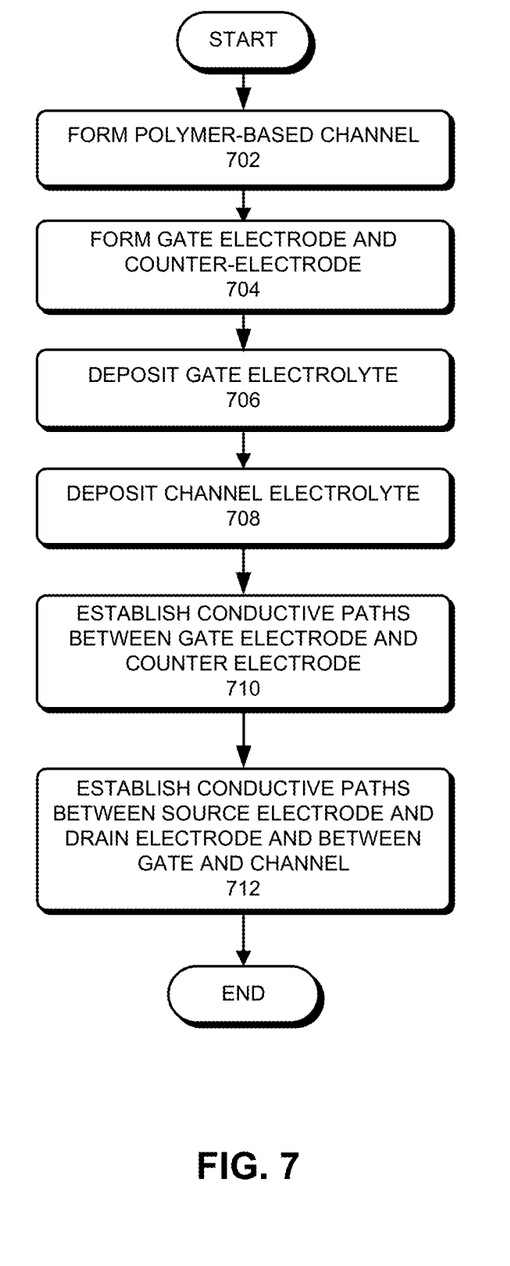
FIG. 7 presents a flowchart illustrating an exemplary process for fabricating an OECT-based single-transistor oscillator, according to one embodiment.

FIG. 7 presents a flowchart illustrating an exemplary process for fabricating an OECT-based single-transistor oscillator, according to one embodiment. During operation, a polymer-based channel is formed (operation 702). Depending on the application, the channel may be formed on different types of substrate, such as fabric, glass, plastics, or paper. The shape and size of the channel can also be chosen based on the application. The source and drain electrodes can be formed prior to or after the formation of the channel.

In additional to the channel, the gate electrode and counter-electrode may also be formed using a printing technology (operation 704). In some embodiments, a Pt-based gate electrode and counter-electrode can be deposited onto the same substrate where the channel is formed.

The gate-electrolyte layer can be placed in such a way that the gate electrolyte can be in direct contact with the gate electrode and counter-electrode (operation 706). If the gate electrolyte is in liquid form, an appropriate confinement mechanism is needed. The confinement mechanism can include a membrane layer separating the gate electrolyte from the subsequently deposited or injected channel electrolyte. The channel electrolyte layer can be deposited between the gate-electrolyte layer (separated by the membrane) and the channel (operation 708). Similarly, a confinement mechanism can be needed for liquid form channel electrolyte.

Conductive paths can be established and a current source can be provided between the gate electrode and the counter-electrode (operation 710). In some embodiments, the current source may be external to the printed oscillator. Alternatively, the current source circuit can also be printed. Similarly, conductive paths and voltage biases can be applied between the source and drain electrodes of the channel, and between the gate electrode and the channel (operation 712), thus completing the fabrication of the OECT-based single-transistor oscillator. The conductive paths can include metal traces printed using various printing technologies, such as ink-jet or screen-printing. The configurations of the conductive paths can be application specific. Depending on the application, the OECT-based single-transistor oscillator can be electrically coupled to any printed or conventional circuit components, including but not limited to: a resistor, a capacitor, an inductor, a diode, a transistor, or a combination thereof.

Compared to traditional quartz- or IC-based oscillators, the OECT-based oscillator can be printable and flexible, making it possible for application in printed electronics or wearable devices. On the other hand, compared to the printed ring oscillator, this novel design only requires a single four-terminal transistor, whereas the ring oscillator often requires multiple stages of transistors, thus significantly reducing the cost, making it easy to incorporate such oscillators in low-cost electronics. Moreover, compared to the ring oscillators, this novel OECT-based single-transistor oscillator has an ultra-low frequency, thus making it the perfect candidate for extremely low-power electronics and low-frequency sensor polling applications.

Figure 8:
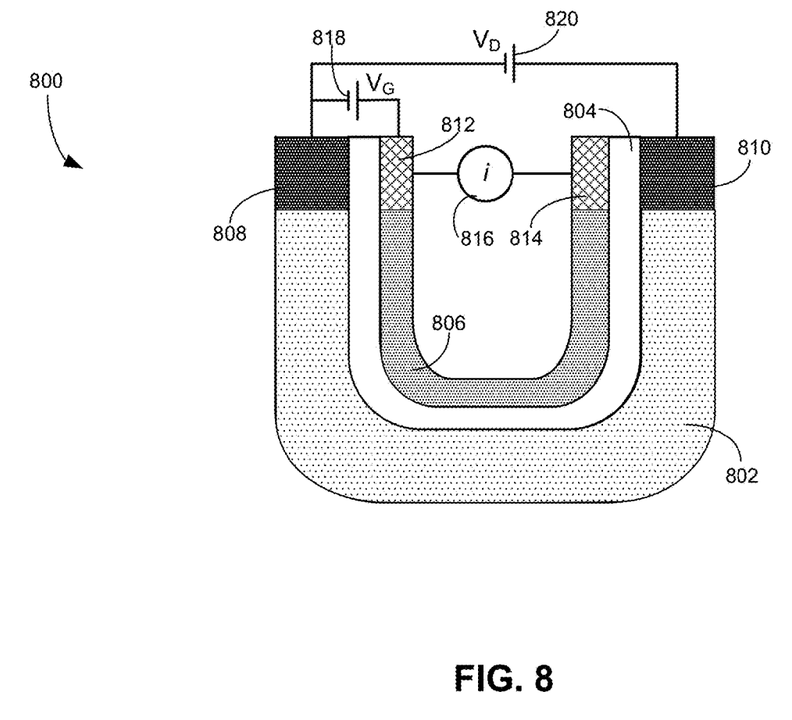
FIG. 8 illustrates an exemplary oscillator, according to one embodiment.

FIG. 8 illustrates an exemplary oscillator, according to one embodiment. In FIG. 8, oscillator 800 can include channel 802, channel electrolyte 804, and gate electrolyte 806. All three components can be shaped like a "U," thus allowing all electrodes to be on the same side of oscillator 800. As discussed previously, channel 802 can be polymer based, whereas channel electrolyte 804 and gate electrolyte 806 can include liquid or solid state electrolyte. If both electrolytes are in liquid form, a membrane (not shown in FIG. 8) can be inserted between channel electrolyte 804 and gate electrolyte 806.

Source and drain electrodes 808 and 810 are on either end of channel 802, whereas gate electrode 812 and counter-electrode 814 are separated by gate electrolyte 806. All the aforementioned components of oscillator 800 can be printed onto a substrate (e.g., be a part of a smart patch). Current source 816 and voltage supplies 818 and 820 can be either printed onto the same substrate or provided by an external circuitry.

In general, the OECT-based single-transistor oscillator can have different sizes and shapes and can be fabricated on different types of substrate material. The different components of the oscillator may have a layered structure or may be coplanar. In addition, the materials used to form the different components, including the channel, the gate electrode, the counter-electrode, the gate electrolyte layer, the membrane, and the channel electrolyte layer, do not limit the scope of the invention.

The above description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

What is claimed is:

1. An oscillator, comprising:
   an organic electrochemical transistor, which comprises a channel and a dynamic gate, wherein the dynamic gate comprises an electrochemical reaction system comprising at least two cross-coupled reaction pathways;
wherein the channel comprises one of: a conductive polymer, a conductive inorganic material, and a small-molecule material; and
wherein an electrochemical potential of the dynamic gate varies substantially periodically, thereby resulting in the organic electrochemical transistor having a drain current that varies substantially periodically.

2. The oscillator of claim 1, wherein the conductive polymer comprises poly(3,4-ethylenedioxythiophene) polystyrene sulfonate (PEDOT:PSS).

3. The oscillator of claim 1, wherein the at least two reaction pathways comprise a direct pathway of formic acid oxidation and an indirect pathway of the formic acid oxidation.

4. The oscillator of claim 1, wherein the dynamic gate comprises a gate electrode, a gate electrolyte, and a counter-electrode, and wherein the gate electrode is coupled to the counter-electrode via the gate electrolyte.

5. The oscillator of claim 4, wherein the dynamic gate further comprises a current source configured to provide a constant current between the gate electrode and the counter-electrode.

6. The oscillator of claim 5, wherein the constant current is between 10 nA and 1 mA.

7. The oscillator of claim 4, wherein the dynamic gate further comprises a voltage source configured to provide a constant voltage bias between the gate electrode and the counter-electrode.

8. The oscillator of claim 7, wherein the constant voltage is between 100 mV and 10 V.

9. The oscillator of claim 4, further comprising a channel electrolyte positioned between the channel and the dynamic gate.

10. The oscillator of claim 9, further comprising a membrane separating the gate electrolyte and the channel electrolyte.

11. The oscillator of claim 10, wherein the membrane comprises one or more of:
a porous glass frit,
an ion-selective membrane,
an ion-conductive glass,
a polymer membrane, and
an ionically conductive membrane.

12. The oscillator of claim 9, wherein the gate electrolyte or the channel electrolyte comprises one or more of:
water,
an organic solvent,
an ionic liquid, and
a polymer electrolyte.

13. The oscillator of claim 12, wherein the gate electrolyte or the channel electrolyte comprises a dissolved organic or inorganic species.

14. The oscillator of claim 1, wherein the drain current of the organic electrochemical transistor varies with time at a frequency between 10 µHz and 100 Hz.

15. A method for fabricating an oscillator, the method comprising:
forming a channel, wherein the channel comprises one of: a conductive polymer, a conductive inorganic material, and a small-molecule material; and
forming a dynamic gate coupled to the polymer-based channel, wherein the dynamic gate comprises an electrochemical reaction system comprising at least two cross-coupled reaction pathways;
wherein an electrochemical potential of the dynamic gate varies substantially periodically, thereby resulting in the organic electrochemical transistor having a drain current that varies substantially periodically.

16. The method of claim 15, wherein the at least two reaction pathways comprise a direct pathway of formic acid oxidation and an indirect pathway of the formic acid oxidation.

17. An organic electrochemical transistor, comprising:
a channel, wherein the channel comprises one of: a conductive polymer, a conductive inorganic material, and a small-molecule material; and
a dynamic gate coupled to the polymer-based channel via a channel electrolyte,
wherein the dynamic gate comprises a gate electrode and a counter-electrode separated from the gate electrode by a gate electrolyte, and wherein an electrochemical potential of the dynamic gate is time-varying, thereby resulting in the organic electrochemical transistor having a drain current that is time-varying.

18. The organic electrochemical transistor of claim 17, wherein the gate electrolyte comprises formic acid.

* * * * *